United States Patent
Richter

(10) Patent No.: US 11,786,995 B2
(45) Date of Patent: Oct. 17, 2023

(54) NONPLANAR WAFER AND METHOD FOR PRODUCING A NONPLANAR WAFER

(71) Applicant: SILTECTRA GmbH, Dresden (DE)

(72) Inventor: Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 1827 days.

(21) Appl. No.: 15/543,878

(22) PCT Filed: Jan. 13, 2016

(86) PCT No.: PCT/EP2016/050574
§ 371 (c)(1),
(2) Date: Nov. 29, 2017

(87) PCT Pub. No.: WO2016/113309
PCT Pub. Date: Jul. 21, 2016

(65) Prior Publication Data
US 2018/0001416 A1    Jan. 4, 2018

(30) Foreign Application Priority Data

Jan. 15, 2015 (DE) ..................... 10 2015 000 451.4

(51) Int. Cl.
*B23K 26/53* (2014.01)
*B23K 26/0622* (2014.01)
(Continued)

(52) U.S. Cl.
CPC .......... *B23K 26/53* (2015.10); *B23K 26/0624* (2015.10); *B28D 1/221* (2013.01);
(Continued)

(58) Field of Classification Search
CPC . H01L 33/00; H01L 33/0093; H01L 33/0079; H01L 21/78; H01L 21/304;
(Continued)

(56) References Cited

U.S. PATENT DOCUMENTS

| | | | |
|---|---|---|---|
| 3,808,674 A | 5/1974 | Francombe et al. | |
| 6,156,623 A | 12/2000 | Hendrix et al. | |

(Continued)

FOREIGN PATENT DOCUMENTS

| | | |
|---|---|---|
| CN | 101842203 | 9/2010 |
| EP | 0966047 | 12/1999 |

(Continued)

OTHER PUBLICATIONS

CN office action of corresponding application—machine translation.

(Continued)

*Primary Examiner* — Nathaniel E Wiehe
*Assistant Examiner* — Spencer H. Kirkwood
(74) *Attorney, Agent, or Firm* — Murphy, Bilak & Homiller, PLLC

(57) ABSTRACT

A method for cutting off at least one portion, in particular a wafer, from a solid body is contemplated. The method includes: modifying the crystal lattice of the solid body by means of a modifier, wherein a number of modifications are produced to form a nonplanar, in particular convex, detachment region in the interior of the solid body, wherein the modifications are produced in accordance with predetermined parameters, wherein the predetermined parameters describe a relationship between a deformation of the portion and a defined further treatment of the portion, detaching the portion from the solid body.

25 Claims, 3 Drawing Sheets

(51) Int. Cl.
  *B28D 1/22* (2006.01)
  *H01L 21/02* (2006.01)
  *B23K 103/00* (2006.01)
  *B23K 26/40* (2014.01)
  *B23K 101/40* (2006.01)

(52) U.S. Cl.
  CPC ........ *H01L 21/02002* (2013.01); *B23K 26/40* (2013.01); *B23K 2101/40* (2018.08); *B23K 2103/52* (2018.08); *B23K 2103/56* (2018.08)

(58) Field of Classification Search
  CPC ............... H01L 21/7813; H01L 21/302; H01L 21/02035; B23K 2103/56; B28D 5/00; B28D 1/30
  See application file for complete search history.

(56) References Cited

U.S. PATENT DOCUMENTS

| | | | |
|---|---|---|---|
| 6,528,394 | B1 | 3/2003 | Samsung |
| 6,829,270 | B2 | 12/2004 | Suzuki |
| 7,315,045 | B2 | 1/2008 | Lee |
| 7,592,629 | B2 | 9/2009 | Lee |
| 7,811,902 | B2 | 10/2010 | Kim |
| 10,611,052 | B1* | 4/2020 | Bubel ................. B28D 5/0011 |
| 2008/0217735 | A1* | 9/2008 | Chen ................. H01L 23/5256 257/E23.149 |
| 2010/0330777 | A1 | 12/2010 | Hanaoka |
| 2012/0058713 | A1* | 3/2012 | Lee .................... H01L 21/3043 451/41 |
| 2012/0125887 | A1 | 5/2012 | Shimoi |
| 2013/0089969 | A1 | 4/2013 | Wagner |
| 2013/0312460 | A1* | 11/2013 | Kunishi ............. B23K 26/0665 65/112 |
| 2013/0316538 | A1 | 11/2013 | Bedell |
| 2014/0038392 | A1* | 2/2014 | Yonehara ............. B81C 1/0038 438/463 |
| 2014/0106649 | A1* | 4/2014 | Kim .................... H01L 21/6835 451/54 |
| 2014/0213039 | A1* | 7/2014 | Lee .................... H01L 21/6835 438/459 |
| 2015/0380242 | A1* | 12/2015 | Chang ............... H01L 21/02381 438/460 |
| 2016/0158880 | A1* | 6/2016 | Koitzsch ................ H01L 21/78 264/400 |

FOREIGN PATENT DOCUMENTS

| | | | |
|---|---|---|---|
| EP | 3137657 A1 | | 3/2017 |
| JP | 2009061462 A | * | 3/2009 |
| WO | 2014/177716 | | 11/2014 |
| WO | 2014177716 | | 11/2014 |

OTHER PUBLICATIONS

International Preliminary Report on Patentability of corresponding PCT application No. PCT/EP2016/050574.

* cited by examiner

NONPLANAR WAFER AND METHOD FOR PRODUCING A NONPLANAR WAFER

The present invention concerns a method for separating at least one solid body portion from a solid body according to claim 1, a method for manufacturing a multi-layered arrangement according to claim 7, a non-planar wafer according to claim 10, and a multi-layered arrangement according to claim 11.

As a general rule wafers are solid body portions, which are separated from a solid body. They largely extend in two dimensions, i.e. their thickness is smaller than their width and length by at least one order of magnitude. Wafers are preferably used in semi-conductor technology to produce solar cells, computer chips, LEDs, etc. The production of wafers is very cost-intensive, for which reason efforts are made to get as many wafers as possible out of one solid body. This leads to the wafers getting ever thinner, which in turn leads to a situation where wafers deform after being coated, if the temperature expansion coefficient of the coating differs from that of the wafer. This type of deformation is known as warp, which describes a curvature of the wafer. Such curvatures are described, for example, in the publications EP0966047A2, U.S. Pat. Nos. 6,528,394, 6,829,270, 7,315,045 and 7,592,629, the contents of which are incorporated by reference in the contents of the present patent document. The deforming of the wafers leads to the produced multi-layered arrangement not being optimally workable, not being exposed to forces to only a limited extent, or that it extends further in the vertical direction than is absolutely necessary.

The aim of the present invention is to provide a solution by which the aforementioned multi-layered arrangements may be manufactured with fewer warps or without warps.

According to the invention, the aforementioned aim may be achieved by a method for separating at least one solid body portion, in particular a wafer, from a solid body. In doing so, the method according to the invention comprises preferably at least the steps of:

modifying the crystal lattice of the solid body by means of a modifier wherein a number of modifications are produced, to form a non-planar, in particular convex, detachment region in the interior of the solid body, wherein the modifications are produced in dependence of predetermined parameters, wherein the predetermined parameters describe a relationship between a deformation of the solid body portion in dependence of a defined further treatment of the solid body and detaching the solid body portion from the solid body.

This solution is advantageous because the solid body portion is preferably produced in such a way that it assumes the required shape as a result of the later treatment. Thus, in dependence of the material characteristics of the solid body portion and the coating, the solid body portion is produced in a form by which the deformation resulting from the coating is exploited in order to create a surface of the multi-layered arrangement that is preferably planar, or largely planar, at least on one side and preferably on both sides.

Further advantageous embodiments are the subject of the following description and/or the sub-claims.

The modifications are produced, in accordance with a further preferred embodiment of the present invention, inside the crystal lattice of the solid body by means of radiation from at least one laser, in particular a picosecond or a femtosecond laser, introduced into the interior of the solid body portion via an outer surface of the solid body portion. In addition or alternatively, it is feasible that the modifications may be produced in the crystal lattice by ion implantation. This embodiment is advantageous since very precise modifications may be produced using laser radiation and/or ion implantation. The detachment region may thus be produced very easily on the basis of the respective parameters.

The individual modifications or defects or damaged areas each result, according to a further preferred embodiment of the present invention, from a multi-photon excitation effected by the laser, in particular a femtosecond laser or a picosecond laser. The laser preferably has a pulse duration of under 10 ps, particularly preferably under 1 ps and most preferably of under 500 fs.

According to a further preferred embodiment of the present invention, the energy of the laser radiation, in particular of the fs laser, is selected in such a way that the damage propagation in the solid body or in the crystal, is smaller than three times the Rayleigh length, preferably smaller than the Rayleigh length and particularly preferably smaller than one-third of the Rayleigh length. The wavelength of the laser radiation, in particular the fs laser, is selected, according to a further preferred embodiment of the present invention, in such a way that the absorption of the solid body or of the material is smaller than 10 cm$^{-1}$ and preferably smaller than 1 cm$^{-1}$ and particularly preferably smaller than 0.1 cm$^{-1}$.

According to a further preferred embodiment of the present invention, the further treatment comprises the arrangement or production of a coating on at least one surface of the solid body portion. The prescribed parameters thus comprise preferably at least data through which the thermal expansion coefficient of the solid body portion material and the coating material is included. In addition or alternatively, the parameters comprise preferably data through which the thickness/height (preferably average thickness/height) and/or the width and/or the length and/or the shape of the solid body portion and/or the coating is included. This embodiment is advantageous, since very precise solid body portions may be produced by it for a variety of (solid body and coating) material combinations.

The solid body or the work piece preferably features a material or a combination of materials from one of the main groups 3, 4 and 5 of the periodic table of the elements, such as for example, Si, SiC, SiGe, Ge, GaAs, InP, GaN, Al2O3 (sapphire), AlN. The solid body features, particularly preferably, a combination of elements found in the third and fifth groups of the periodic table. Feasible materials or material combinations in this context are, for example, gallium arsenide, silicon, silicon carbide, etc. Furthermore, the solid body may feature a ceramic (e.g. Al2O3—aluminium oxide), or consist of a ceramic. Preferred ceramics in this context are, for example, perovskite ceramics in general (such as for example, ceramics containing Pb, O, Ti/Zr), and lead-magnesium niobate, barium titanate, lithium titanate, yttrium-aluminium-garnet, in particular yttrium-aluminium-garnet crystals for solid body laser applications, SAW ceramics (surface acoustic wave) such as, for example, lithium niobate, gallium orthophosphate, quartz, calcium titanate etc. in particular. The solid body thus preferably features a semi-conductor material or a ceramic material, or particularly preferably consists of a semi-conductor material or a ceramic material. Furthermore, it is feasible that the solid body features a transparent material, or partially consists of or is made from a transparent material such as, for example, sapphire. In this context, further materials that may be considered on their own or in combination with other materials as solid body material are for example 'wide band gap' materials, InAlSb, high-temperature temperature super conductors, in particular rare earth cuprates (.g. YBa2Cu3O7). In addition or alternatively, it is feasible that the solid body may be a photomask, wherein in the present case the use of all photomask materials known up to the application date, and particularly preferably combinations thereof, would be preferred.

In accordance with a further preferred embodiment of the present invention, more than 5%, in particular more than 10% or more than 20% or more than 30% or more than 40% or more than 50% or more than 60% or more than 70% or more than 80% or more than 90% or more than 95% of the crystal lattice formed during the development of the detachment region is changed or, in particular, damaged by means of the modifications. This embodiment is advantageous because, for example, the laser application changes the crystal lattice in such a way, or produces such defects, in particular micro-cracks, that the forces required to separate the solid body portion from the solid body may be adjusted. It is thus possible for the purposes of the present invention, that the crystal structure in the detachment region may be modified or damaged by the laser radiation in such a way that the solid body portion is detached or separated from the solid body as a result of the laser treatment.

According to a further preferred embodiment of the present invention, the detachment of the solid body portion from the solid body comprises at least the steps of arranging a receiving layer on the solid body to hold the solid body portion, and thermally impacting the receiving layer for the, in particular mechanical, production of stresses in the solid body, wherein the stresses propagate a crack in the solid body along the detachment region, by which the solid body portion is separated from the solid body. This embodiment is advantageous because very accurate and defined forces may be produced in order to separate the solid body portion from the solid body.

According to a further preferred embodiment of the present invention, the receiving layer features, or consists of, a polymer, in particular PDMS, wherein the thermal impact occurs in such a way that the polymer undergoes a glass transition.

The receiving layer preferably consists of polydimethylsiloxane (PDMS) or features polydimethylsiloxane (PDMS).

The thermal impact preferably represents a cooling of the receiving layer to or below the ambient temperature, and preferably under 10° C. and particularly preferably under 0° C. and more preferably under −10° C. The cooling of the receiving layer, which is preferably formed of a polymer layer, most preferably occurs in such a way that at least one part of the receiving layer, which preferably features or consists of PDMS, undergoes a glass transition. In this context, the cooling may be a cooling down to under −100° C., which for example, may be effected by means of liquid nitrogen. This is advantageous because the receiving layer contracts in dependence of the temperature change, in particular undergoes a glass transition, and transmits the resulting forces to the solid body, whereby mechanical stresses may be produced in the solid body, which may lead to the initiation or propagation of a crack.

The aim is further achieved by a method for producing a multi-layered arrangement. The method for producing a multi-layered arrangement comprises preferably at least the steps of: providing a wafer, in particular a convex wafer, with a first non-planar form; arranging or producing a further layer on at least one surface of the wafer; wherein the further layer and the wafer have different thermal expansion coefficients, wherein the further layer is arranged or produced on the surface at a coating temperature which is different from a target temperature, and wherein the further layer is formed in such a way that on reaching the target temperature it impacts on the wafer in such a way that the wafer is deformed, from the first non-planar shape into a second shape which is different from the first shape, wherein the second shape represents a planar shape. The non-planar solid body preferably features a warp or forms a warp which is negative, or largely negative, relative to the deformation of the solid body portion caused by the coating.

This solution is advantageous because advantageously, due to the defined shaping of the wafer, the deformation occurring as a result of the coating is exploited, in order to obtain a multi-layered arrangement which is preferably planar on at least one side. It is particularly preferable that the further layer be produced by epitaxy.

In addition it is feasible that the wafer is provided with a coating as early as before the arrangement or production of the further layer.

Furthermore, the present invention equally concerns a non-planar solid body portion, in particular on a non-planar, in particular convex, wafer. The non-planar, in particular convex, solid body portion is thereby preferably produced according to a method which preferably comprises at least the hereinafter-mentioned steps:

providing a solid body from which to separate the non-planar wafer; modifying the crystal lattice of the solid body by means of a modifier, in particular a laser, in particular a picosecond laser or a femtosecond laser, wherein a number of modifications are produced in the crystal lattice in order to form a non-planar detachment region, wherein the modifications (19) are produced on the basis of predetermined parameters, wherein the predetermined parameters describe a relationship between a deformation of the solid body portion in dependence of a defined further treatment of the solid body portion, detaching the solid body portion from the solid body.

Furthermore, the present invention concerns particularly preferably a multi-layered arrangement. The multi-layered arrangement according to the invention features preferably at least one solid body portion, in particular a wafer, wherein the solid body portion is manufactured according to a method corresponding to one of claims 1 to 6 and initially has at least one non-planar surface. Furthermore, the multi-layered arrangement has at least one coating arranged or produced on the solid body portion, wherein the coating is arranged or produced on the solid body portion at a coating temperature differing from a target temperature, wherein the solid body portion has a deformation surface with an initially non-planar first surface shape, wherein the temperature expansion coefficient of the solid body portion material and the temperature expansion coefficient of the coating material differ from one another, wherein the deformation surface of the coated solid body portion, at the target temperature, forms a second surface shape, wherein the second surface shape and the first surface shape differ from one another.

In all cases, when used in the context of the present invention, the use of the word 'largely' preferably defines a deviation in the range of 1% to 30%, in particular from 1% to 20%, in particular from 1% to 10%, in particular from 1% to 5%, in particular from 1% to 2%, from the stipulation which would be true if this word were not used.

Further advantages, aims and characteristics of the present invention are explained below by way of the descriptions and the attached drawings in which, by way of example, the solid body manufacture or wafer manufacture according to the invention is depicted. Components or elements of the solid body manufacture or wafer manufacture according to the invention, which in the figures at least largely coincide as regards their function, may hereby be identified by the same reference symbols, wherein these components or elements do not need to be explained or labelled in all of the figures.

Figure 1C:
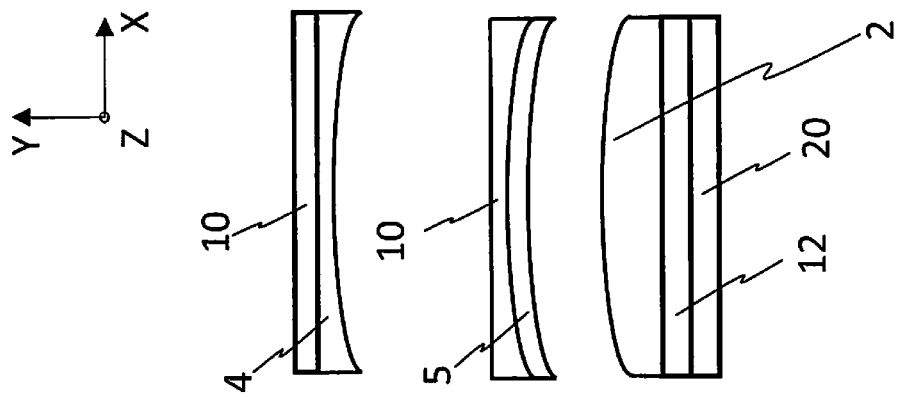
FIG. 1c shows a schematic depiction of a layered arrangement after a solid body layer has been separated from a solid body.
Figure 1B:
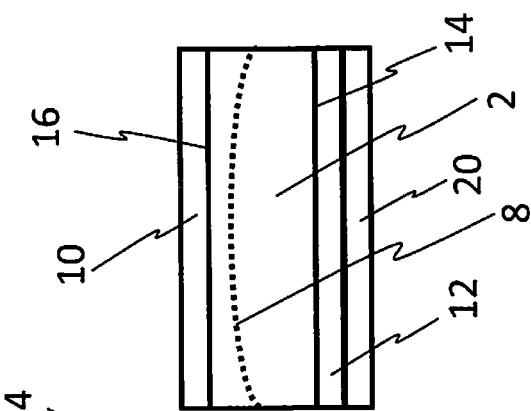
FIG. 1b shows a schematic depiction of a layered arrangement before a solid body layer has been separated from a solid body.
Figure 1A:
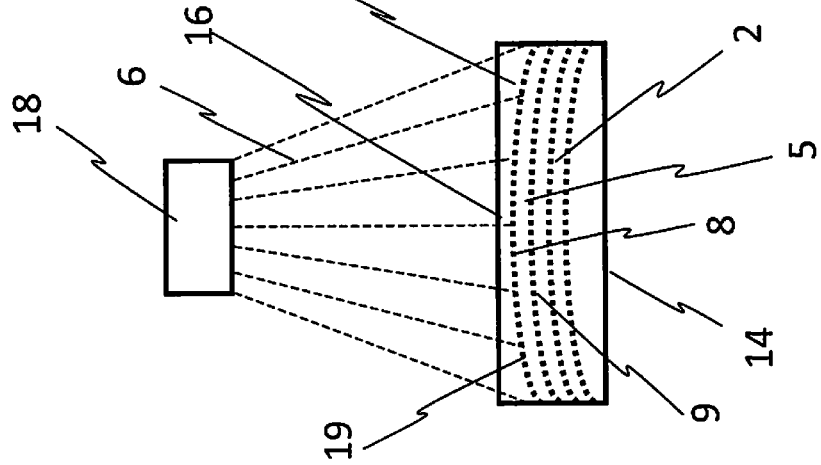
FIG. 1a shows a schematic structure for producing defects in a solid body.

FIG. 1a shows a solid body 2 or a substrate, which is arranged in the area of a radiation source 18, in particular a laser. The solid body 2 preferably has a first planar surface portion 14 and a second planar surface portion 16, wherein the first planar surface portion 14 is preferably aligned largely or exactly parallel to the second planar surface portion 16. The first planar surface portion 14 and the second planar surface portion 16 preferably delimit the solid body 2 in a Y direction, which is preferably vertically or perpendicularly aligned. The planar surface portions 14, 16 preferably extend respectively in an X-Z plane, wherein the X-Z plane is preferably horizontally aligned. Alternatively however, it is feasible that the first and/or the second surface portion 14, 16 has a non-planar, in particular, convex shape.

Furthermore, it can be seen from this depiction that the radiation source 18 is emitting radiation towards the solid body 2. The radiation 6, according to its configuration or in dependence of prescribed parameters, penetrates a defined depth into the solid body and produces, at the respective location or at the respective predetermined location, a crystal lattice modification 19, in particular a defect. It is preferable that enough modifications or crystal lattice modifications 19 are produced that they define at least one detachment region 8. The detachment region 8 preferably has a non-planar contour or a non-planar shape, wherein the detachment region 8 particularly preferably has, at least in sections, a spherical, in particular wavy and/or convex and/or curved shape. Furthermore the rays 6 may be directed through a lens (not shown), which is preferably arranged between the radiation source 18 and the foreign body 2, for example in order to focus or bunch the radiation.

The reference symbol 9 identifies a further detachment region in the solid body 2. According to the present invention, the further detachment region 9 may equally be produced during the production of the detachment region 8. Alternatively, it is feasible that the further detachment region 9 may be produced after or before the production of the detachment region 8. The further detachment region 9 is preferably produced after the separation of the solid body portion 4 or before the separation of the solid body portion 4. Preferably, in one solid body 2, a number of solid body portions 4, 5 are defined by a number of detachment regions 8, 9, and may preferably be separated from the solid body 2 one after the other. According to a preferred embodiment of the present invention exactly or at least or at most one detachment region 8 is produced in one solid body 2. According to a further preferred embodiment of the present invention, two, at least two or exactly two, or three, at least three or exactly three, or four, at least four or exactly four, or five, at least five or exactly five or a number of, in particular for example up to 10 or 25 or 50 or 100 or 500, detachment regions are produced in the solid body 2.

FIG. 1b shows a multi-layered arrangement, wherein the solid body 2 contains the detachment region 8 and is provided with a holding layer 12 in the area of the first surface portion 14, which in turn is preferably overlaid by a further layer 20, wherein the further layer 20 is preferably a stabilising means, in particular a metal plate. A receiving layer, in particular a polymer layer 10, is preferably arranged on the second surface portion 16 of the solid body 2. The receiving layer 10 and/or the holding layer 12 preferably consist, at least partially and particularly preferably completely, of a polymer, in particular of PDMS.

Alternatively it is feasible that the receiving layer 10 is produced on the surface of the solid body 2, for example, by means of epitaxy. The receiving layer 10 which is produced and the solid body 2 preferably have different temperature expansion coefficients. After the receiving layer 10, which in this case can also be understood as the coating 50, has been produced, a cooling of the multi-layer arrangement which has been produced follows, resulting in stresses caused by the differing thermal expansion coefficients, as a result of which the solid body portion 4 is separated or detached from the solid body 2 along the detachment region 8.

FIG. 1c shows a situation following triggering of a crack and subsequently directing the crack. The solid body layer 4 adheres to the polymer layer 10 and is or may be spaced apart from the remaining part of the solid body 2.

Furthermore, according to the present invention, different detachment regions 8, 9 may have different shapes or contours. Furthermore, it is feasible that, for example, the second surface portion 16, which is a surface of the subsequently separated solid body portion 4, 5 may be brought into another shape before the separation of the solid body portion 4, 5. This change of shape may occur in an analogous manner to the separation of the solid body portion 4, 5 or be effected by a machining process, in particular a grinding process.

The present invention therefore relates to a method for manufacturing solid body layers. In this context, the method according to the invention comprises at least the steps of providing a solid body 2 for separating at least one solid body layer 4, producing modifications, such as crystal lattice defects, by means of at least one modifier, in particular a radiation source, in particular at least one laser, in particular at least one fs laser, in the interior structure of the solid body for specifying at least one detachment region 8, 9 along which the solid body layer(s) 4, 5 are separated from the solid body 2. The method according to the invention further comprises the step of thermally impacting a polymer layer 10 arranged on the solid body 2 for producing in particular mechanical stresses in the solid body 2, wherein as a result of the stresses a crack spreads in the solid body 2 along the detachment region 8, which separates the solid body layer 4 from the solid body 2.

Figure 2B:
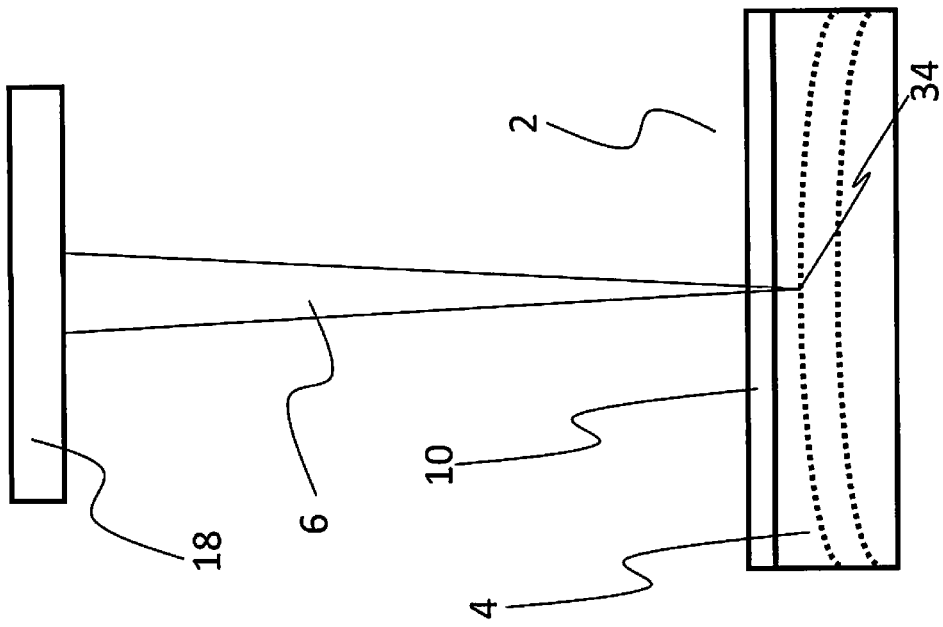
FIG. 2b shows a second schematically depicted option for producing a defect by means of laser radiation.
Figure 2A:
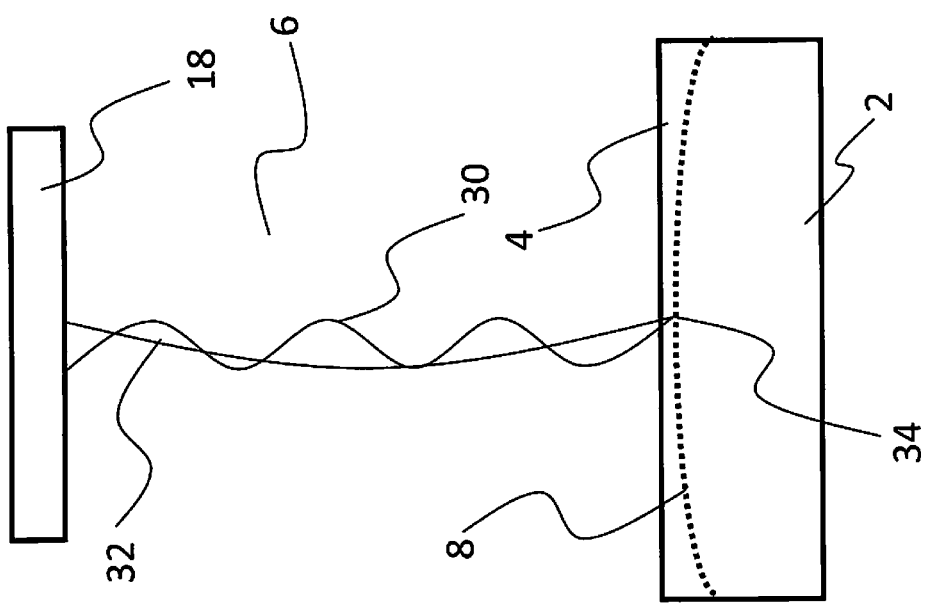
FIG. 2a shows a first schematically depicted option for producing a defect by means of laser radiation.

FIGS. 2a and 2b show examples for the production, as shown in FIG. 1a, of a detachment region 8 through the introduction of modifications 19, in particular defects or damaged areas, in a solid body 2 by means of laser radiation 6.

FIG. 2a thus shows schematically how modifications 19 may be produced in a solid body 2, in particular for producing a detachment region 8 by means of a radiation source 18, in particular one or a number of lasers, in particular one or a number of fs lasers. The radiation source 18 emits radiation 6 with a first wavelength 30 and a second wavelength 32. In this context, the wavelengths 30, 32 are adjusted to one another in such a way, or the distance between the radiation source 18 and the detachment region 8 to be produced is adjusted in such a way, that the waves 30, 32 largely or exactly coincide on the detachment region 8 in the solid body 2, whereby a defect is produced in the area 34 of coincidence as a result of the energy in both waves 30, 32. In this context, the production of the defect may be brought about by different or combined disintegrating mechanisms such as, for example, sublimation or chemical reaction, wherein disintegration in this context may be initiated, for example, thermally and/or photo chemically.

FIG. 2b shows a focused light beam 6, the focal point of which preferably lies in the detachment region 8. In this case it is feasible that the light beam 6 is focused through one or a number of focusing bodies, in particular a lens/lenses (not shown).

Figure 3A:
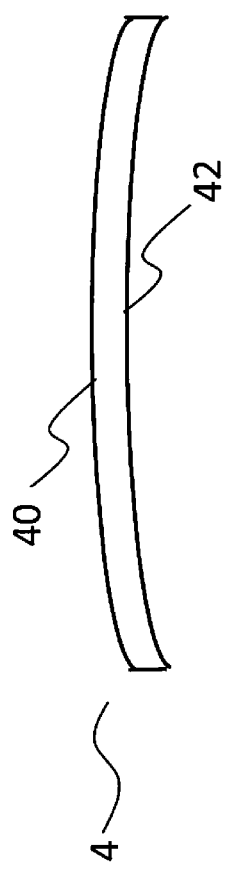
FIG. 3a shows a schematic lateral view of a non-planar wafer according to the invention.

FIG. 3a depicts a non-planar solid body portion 4 according to the invention, or a non-planar wafer, wherein, according to one depiction, the solid body portion 4 or the wafer 4 forms a warp or shows a cross-section of a warp. In this context it is feasible that the solid body portion 4 has two surface contours or surface shapes which are formed so as to be negative to one another. However, it is equally feasible that the surface contours or surface shapes of the two opposing main surfaces 40, 42 of the solid body portion 4 are not formed so as to be negative to one another, but rather have different contours or shapes from one another.

Figure 3B:
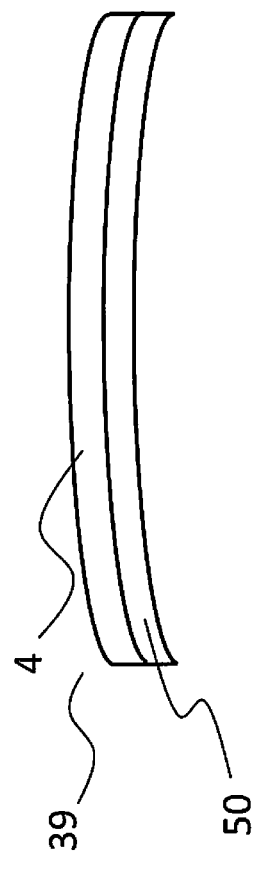
FIG. 3b shows a schematic lateral view of a non-planar wafer according to the invention with a coating arranged or produced on it.

FIG. 3b shows the production of a coating 50, in particular a coating produced by epitaxy. The coating 50 is preferably arranged or produced on the solid body portion 4 at a temperature of over 50° C., in particular over 100° C. or over 150° C. or over 200° C. or over 300° C. or over 400° C. In this case it is feasible that the coating 50 is arranged or produced with a largely constant or with a constant thickness on the solid body portion 4. Alternatively however, it is equally feasible that the coating 50 has locally differing thicknesses. The further treatment thus preferably represents the arrangement or production of a defined coating 50 on at least one surface 40, 42 of the solid body portion 4. The prescribed parameters thus comprise preferably at least data, through which, at least indirectly, the thermal expansion coefficients of the material of the solid body portion 4 and the material of the coating 50 are included, or through which a deformation of the solid body portion 4 is included or prescribed as a result of a defined tempering of the solid body portion 4 provided with the coating 50.

Figure 3C:
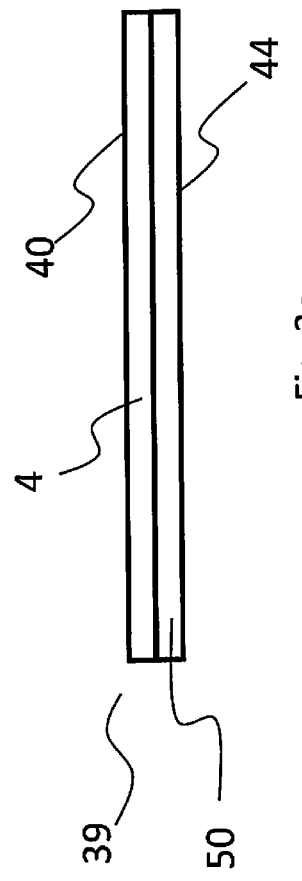
FIG. 3c shows a schematic lateral view of a preferred form of a multi-layered arrangement according to the invention after a defined tempering.

FIG. 3c shows a situation following the production or arrangement of the coating 50 on at least one surface 40, 42 of the solid body portion 4, wherein the shape of the multi-component arrangement 39 produced has changed because of differing thermal expansion coefficients. Preferably at least one of the main surfaces 40 and 44 of the multi-component arrangement 39 or multi-layered arrangement is transformed into a planar, or largely planar shape. The deformation is preferably a result of a preferably defined tempering, in particular heating or cooling of the multi-layered arrangement 39.

Thus, according to the invention, the solid body portion 4 is shaped in dependence of the downstream treatment process, in particular the coating process, in such a way that following the treatment, in particular the coating process, the shape of one or both main surfaces 40, 42 of the solid body portion 4, changes in a defined manner, in particular flattens or becomes non-planar. In the context of the coating it is particularly preferable that this involves a metal layer or a semi-conductor layer, in particular a gallium nitride layer (GaN) or silicon layer, which is arranged or produced on a solid body portion made of silicon, sapphire, silicon carbide (SiC) or gallium arsenide (GaAs).

The invention thus concerns a method for separating a solid body portion 11, in particular a wafer, from a solid body 2. The method comprises at least the steps of:

modifying the crystal lattice of the solid body 2 by means of a modifier 18, wherein a number of modifications 19 are produced in order to form a non-planar, in particular arched, detachment region 8 in the interior of the solid body, wherein the modifications 19 are produced in dependence of prescribed parameters, wherein the prescribed parameters describe a relationship between a deformation of the solid body portion 4 in dependence of a defined further treatment of the solid body portion 4, detaching the solid body portion 4 from the solid body 2.

REFERENCE LIST 2 solid body
4 solid body portion
5 further solid body portion
6 radiation
8 detachment region
9 further detachment region
10 receiving layer
12 holding layer
14 first surface portion
16 second surface portion
18 radiation source
19 modification
20 stabilising means
30 first radiation section
32 second radiation section
34 area of defect production
40 first main surface of the solid body portion
42 second main surface of the solid body portion
44 second main surface of the multi-component arrangement
50 coating
X first direction
Y second direction
Z third direction

The invention claimed is:

1. A method for producing a nonplanar wafer, the method comprising:

arranging a solid body in an area of a laser radiation source, the solid body delimited by a first surface portion and a second surface portion;

emitting radiation from the laser radiation source towards the solid body along a horizontal plane such that the radiation penetrates the solid body and produces a plurality of crystal lattice modifications, the crystal lattice modifications defining a first detachment region in the solid body, the first detachment region having a non-planar contour along the horizontal plane; and separating a wafer from the solid body along the first detachment region.

2. The method of claim 1, wherein the first detachment region has, at least in sections along the horizontal plane, a spherical shape.

3. The method of claim 1, wherein the first detachment region has, at least in sections along the horizontal plane, a wavy shape.

4. The method of claim 1, wherein the first detachment region has, at least in sections along the horizontal plane, a convex shape.

5. The method of claim 1, wherein the first detachment region has, at least in sections along the horizontal plane, a curved shape.

6. The method of claim 1, further comprising:
defining a second detachment region in the solid body via further crystal lattice modifications produced by the radiation emitted from the laser radiation source, the second detachment region having a non-planar contour along the horizontal plane; and
separating a second wafer from the solid body along the second detachment region.

7. The method of claim 6, wherein the second detachment region is produced during production of the first detachment region.

8. The method of claim 6, wherein the second detachment region is produced after or before production of the first detachment region.

9. The method of claim 6, wherein the first wafer and the second wafer are separated from the solid body one after the other.

10. The method of claim 6, wherein the first detachment region and the second detachment region have different shapes or contours along the horizontal plane.

11. The method of claim 6, further comprising:
changing a shape of the second surface portion of the solid body before the separation of the second wafer,
wherein the second surface portion is a surface of the second wafer after the separation of the second wafer.

12. The method of claim 1, further comprising:
providing a holding layer in an area of the first surface portion of the solid body.

13. The method of claim 12, further comprising:
overlaying a further layer on the holding layer.

14. The method of claim 13, wherein the further layer is a metal plate.

15. The method of claim 12, wherein the holding layer comprises a polymer.

16. The method of claim 15, wherein the polymer is PDMS.

17. The method of claim 1, further comprising:
changing a shape of the second surface portion of the solid body before the separation of the first wafer,
wherein the second surface portion is a surface of the first wafer after the separation of the first wafer.

18. The method of claim 17, wherein changing the shape of the second surface portion of the solid body before the separation of the first wafer comprises:
machining the second surface portion of the solid body before the separation of the first wafer.

19. The method of claim 17, wherein changing the shape of the second surface portion of the solid body before the separation of the first wafer comprises:
grinding the second surface portion of the solid body before the separation of the first wafer.

20. The method of claim 12, wherein the radiation is configured based on a thermal expansion coefficient of both the solid body and the holding layer.

21. The method of claim 1, further comprising:
defining a plurality of additional detachment regions in the solid body via further crystal lattice modifications produced by the radiation emitted from the laser radiation source, each of the additional detachment regions having a non-planar contour along the horizontal plane, the first detachment region and the additional detachment regions being spaced apart from one another in a vertical direction of the solid body that is perpendicular to the horizontal plane; and
separating an additional wafer from the solid body along each of the additional detachment regions.

22. The method of claim 1, wherein emitting the radiation from the laser radiation source comprises:
emitting the radiation with first and second wavelengths; and
adjusting the first and second wavelengths to one another or adjusting a distance between the radiation source and the first detachment region such that the first and second waves coincide on the first detachment region in the solid body and a defect is produced in each area of coincidence as a result of the energy in the first and second waves.

23. The method of claim 1, further comprising:
applying an epitaxy coating on at least one surface of the wafer to form a multi-layered arrangement; and
tempering the multi-layered arrangement.

24. The method of claim 1, further comprising:
further treating the wafer after the separating, the further treating causing a deformation of the wafer; and
prior to the separating, configuring the radiation based on the deformation expected by the further treating such that at least one main surface of the wafer is planar after the treating.

25. The method of claim 24, wherein configuring the radiation based on the deformation expected by the further treating comprises:
configuring the radiation based on material characteristics of the wafer and a coating applied to the wafer during the treating.

* * * * *